United States Patent
Suzuki (10) Patent No.: US 11,069,520 B2
(45) Date of Patent: Jul. 20, 2021

(54) SUBSTRATE PROCESSING METHOD

(71) Applicant: TOKYO ELECTRON LIMITED, Tokyo (JP)

(72) Inventor: Hiroyuki Suzuki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/052,831

(22) Filed: Aug. 2, 2018

(65) Prior Publication Data

US 2019/0043739 A1  Feb. 7, 2019

(30) Foreign Application Priority Data

Aug. 4, 2017 (JP) .............................. JP2017-151488

(51) Int. Cl.
| | |
|---|---|
| *H01L 21/02* | (2006.01) |
| *H01L 21/67* | (2006.01) |
| *H01L 21/3213* | (2006.01) |

(52) U.S. Cl.
CPC .. *H01L 21/02052* (2013.01); *H01L 21/32134* (2013.01); *H01L 21/67023* (2013.01); *H01L 21/67028* (2013.01); *H01L 21/67034* (2013.01); *H01L 21/67051* (2013.01)

(58) Field of Classification Search
CPC ......... H01L 21/67023; H01L 21/67028; H01L 21/67034; H01L 21/67051; H01L 21/02057; H01L 21/02082
See application file for complete search history.

(56) References Cited

U.S. PATENT DOCUMENTS

| | | | | |
|---|---|---|---|---|
| 2009/0032067 A1* | 2/2009 | Kojimaru | .......... | H01L 21/67028 134/26 |
| 2013/0174873 A1* | 7/2013 | Yoshihara | ................ | H05K 3/26 134/19 |
| 2014/0127908 A1* | 5/2014 | Okutani | ............ | H01L 21/02068 438/694 |
| 2016/0372320 A1* | 12/2016 | Emoto | .............. | H01L 21/68728 |

FOREIGN PATENT DOCUMENTS

JP        2016096317 A      5/2016

* cited by examiner

*Primary Examiner* — Duy Vu N Deo
(74) *Attorney, Agent, or Firm* — Nath, Goldberg & Meyer; Jerald L. Meyer; Tanya E. Harkins (57) ABSTRACT

A substrate processing method includes: supplying a treatment liquid to a substrate held in a horizontal position; substituting the treatment liquid supplied to the substrate with a solvent having a lower surface tension than the treatment liquid; and drying the substrate by shaking off the solvent on the substrate at a preset rotation number so that an intermediate portion of the substrate located between a central portion and a peripheral portion of the substrate is last dried.

9 Claims, 8 Drawing Sheets

SUBSTRATE PROCESSING METHOD

CROSS-REFERENCE TO RELATED APPLICATION

This application is based upon and claims the benefit of priority from Japanese Patent Application No. 2017-151488, filed on Aug. 4, 2017, the entire contents of which are incorporated herein by reference.

TECHNICAL FIELD

The present disclosure relates to a substrate processing method and a storage medium.

BACKGROUND

A conventional semiconductor manufacturing process may include a process of treating a substrate such as a semiconductor wafer (hereinafter simply referred to as a wafer) with a chemical liquid and then removing the chemical liquid with a rinsing liquid. Further, in order to dry (evaporate) the rinsing liquid, a drying process of substituting the rinsing liquid on the surface of the wafer with volatile IPA (IsoPropyl Alcohol) and then shaking the IPA off (hereinafter also referred to as IPA drying) may be performed.

However, in conventional IPA drying, a phenomenon that a pattern formed on the wafer collapses due to a surface tension of the IPA (hereinafter also referred to as pattern collapse) may occur particularly in a peripheral portion of the wafer.

SUMMARY

Some embodiments of the present disclosure provide a substrate processing method and a storage medium which are capable of suppressing pattern collapse at a peripheral portion of a wafer.

According to one embodiment of the present disclosure, a substrate processing method includes: supplying a treatment liquid to a substrate held in a horizontal position; substituting the treatment liquid supplied to the substrate with a solvent having a lower surface tension than the treatment liquid; and drying the substrate by shaking off the solvent on the substrate at a preset rotation umber so that an intermediate portion of the substrate located between a central portion and a peripheral portion of the substrate is last dried.

According to one embodiment of the present disclosure, there is provided a non-transitory computer-readable storage medium storing a program that is operated on a computer and controls a substrate processing apparatus, which includes: a treatment liquid supply part that supplies a treatment liquid to a substrate held in a horizontal position; a substitution part that substitutes the treatment liquid supplied to the substrate with a solvent; and a drying part that shakes off the solvent on the substrate, wherein the program is executed to cause the computer to control the substrate processing apparatus to perform the above-described method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the following description, embodiments of a method of processing a substrate and a substrate processing apparatus according to the present disclosure will be described in detail with reference to the accompanying drawings. It should be noted that the present disclosure is not limited by the following embodiments.

<Outline of Substrate Processing>

First, an outline of substrate processing in a substrate processing system 1 (see FIG. 2) will be described with reference to FIG. 1, which is a view showing the outline of substrate processing according to an embodiment.

Figure 1A:
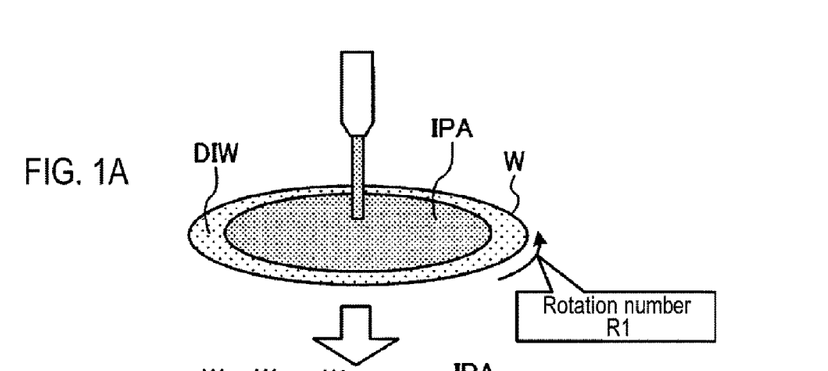
FIGS. 1A to 1D are views showing an outline of substrate processing according to an embodiment.

As shown in FIG. 1A, IPA, which is a solvent having a lower surface tension than DIW (De-Ionized Water), is supplied to a surface of a semiconductor wafer W (hereinafter simply referred to as a wafer W) to which the DIW as a treatment liquid is already supplied, and a substituting process of substituting the DIW on the wafer W with the IPA is then performed. This substituting process is performed while rotating the wafer W at a relatively low rotation number R1.

Figure 1B:
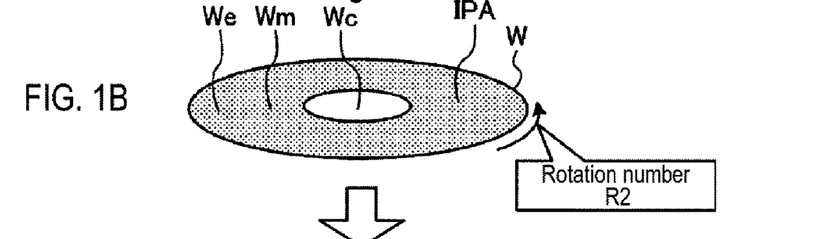

Next, as shown in FIG. 1B, a drying process of shaking off the IPA on the wafer W is performed by rotating the wafer W at a rotation number R2 higher than the rotation number R1. In this drying process, the IPA on the wafer W is first dried (evaporated) at a central portion Wc of the wafer W.

Figure 1C:
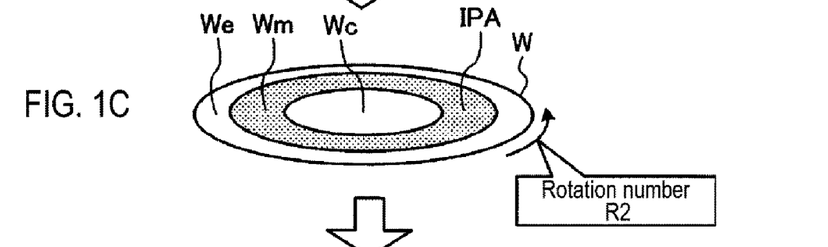

In the drying process according to the embodiment, as shown in FIG. 1C, IPA at a peripheral portion We of the wafer W is dried (evaporated) earlier than IPA at an intermediate portion Wm of the wafer W by rotating the wafer W at the preset rotation number R2. The intermediate portion Wm of the wafer W is located between the central portion Wc and the peripheral portion We of the wafer W.

Figure 1D:
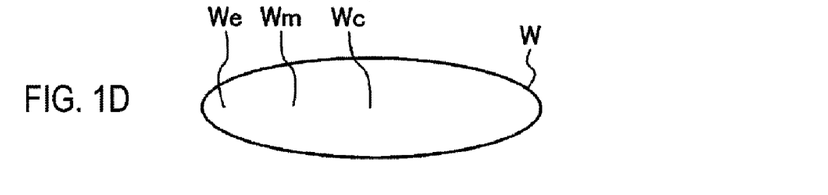

Further, as shown in FIG. 1D, IPA remaining in the intermediate portion Wm of the wafer W is last dried (evaporated) by rotating the wafer W at the preset rotation number R2, completing the drying of the entire wafer W.

With the above substrate processing, it is possible to reduce a contact time between the IPA and a pattern at the peripheral portion We of the wafer W. Therefore, a time during which a surface tension of the IPA acts on the pattern formed on the peripheral portion We can be reduced. Accordingly, it is possible to prevent pattern collapse at the peripheral portion We of the wafer W.

<Outline of Substrate Processing System>

Subsequently, the general configuration of the substrate processing system 1 according to an embodiment will be described with reference to FIG. 2, which is a view showing the general configuration of the substrate processing system 1 according to the embodiment. In the following description, in order to clarify a positional relationship, X axis, Y axis, and Z axis orthogonal to one another are defined and the Z axis positive direction is taken as a vertical upward direction.

Figure 2:
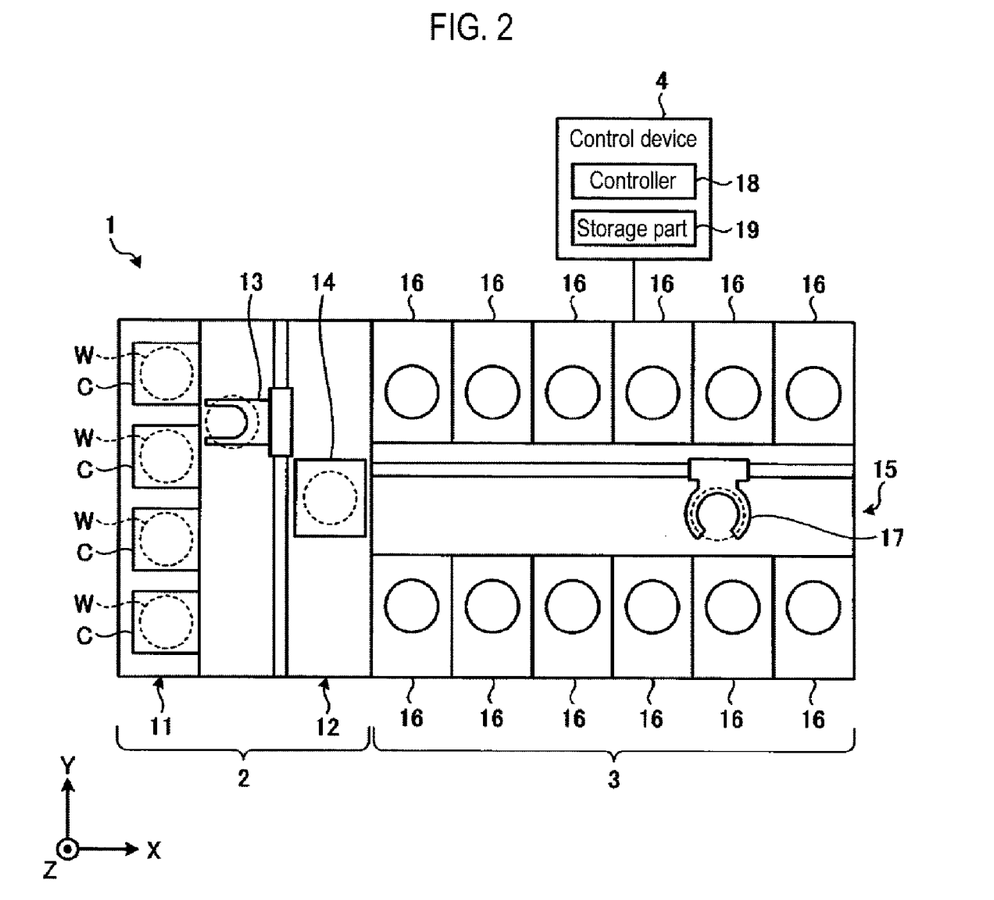
FIG. 2 is a schematic view showing a general configuration of a substrate processing system according to an embodiment.

As shown in FIG. 2, the substrate processing system 1 includes a loading/unloading station 2 and a processing station 3 which are installed adjacent to each other.

The loading/unloading station 2 includes a carrier mounting part 11 and a transfer part 12. A plurality of substrates, in this embodiment, a plurality of carriers C in which wafers W are accommodated in a horizontal position, is mounted on the carrier mounting part 11.

The transfer part 12 is installed adjacent to the carrier mounting part 11 and includes a substrate transfer device 13 and a delivery part 14 therein. The substrate transfer device 13 includes a wafer holding mechanism for holding the wafer W. The substrate transfer device 13 is capable of moving in the horizontal and vertical directions and rotating about the vertical axis, and transfers the wafer W between the carriers C and the delivery part 14 by means of the wafer holding mechanism.

The processing station 3 is installed adjacent to the transfer part 12. The processing station 3 includes a transfer part 15 and a plurality of processing units 16. The plurality of processing units 16 is installed side by side on both sides of the transfer part 15.

The transfer part 15 includes a substrate transfer device 17 therein. The substrate transfer device 17 includes a wafer holding mechanism for holding the wafer W. The substrate transfer device 17 is capable of moving in the horizontal and vertical directions and rotating around the vertical axis, and transfers the wafer W between the delivery part 14 and the processing units 16 by means of the wafer holding mechanism.

The processing units 16 perform predetermined substrate processing on the wafer W that is transferred by the substrate transfer device 17.

The substrate processing system 1 further includes a control device 4. The control device 4 is, for example, a computer and includes a controller 18 and a storage part 19. A program for controlling various processes to be executed in the substrate processing system 1 is stored in the storage part 19. The controller 18 controls the operation of the substrate processing system 1 by reading out and executing the program stored in the storage part 19.

This program may be recorded in a computer-readable storage medium and installed in the storage part 19 of the control device 4 from the storage medium. Examples of the computer-readable storage medium may include a hard disk (HD), a flexible disk (FD), a compact disk (CD), a magneto-optical disk (MO), a memory card, and the like.

In the substrate processing system 1 configured as above, first, the substrate transfer device 13 of the loading/unloading station 2 takes out the wafer W from the carrier C mounted on the carrier mounting part 11, and mounts the taken-out wafer W on the delivery part 14. The wafer W mounted on the delivery part 14 is taken out from the delivery part 14 by the substrate transfer device 17 of the processing station 3 and loaded into the processing unit 16.

The wafer W loaded into the processing unit 16 is processed by the processing unit 16, and then unloaded from the processing unit 16 and mounted on the delivery part 14 by the substrate transfer device 17. Then, the processed wafer W mounted on the delivery part 14 is returned to the carrier C on the carrier mounting part 11 by the substrate transfer device 13.

<Outline of Processing Unit>

Figure 3:
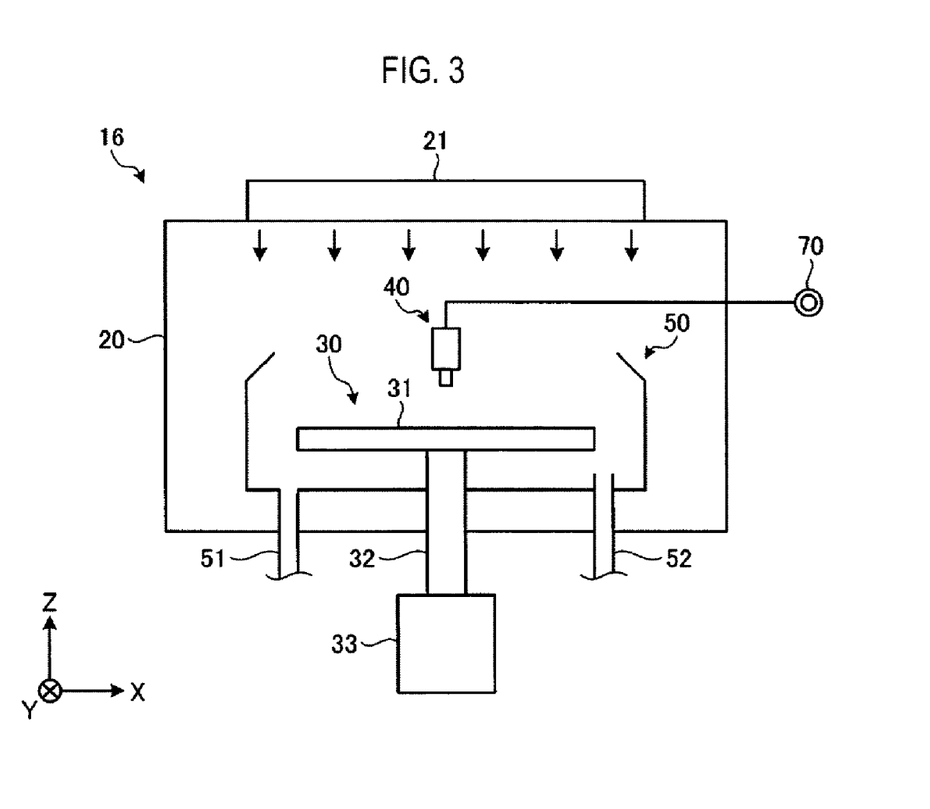
FIG. 3 is a schematic view showing a configuration of a processing unit.

Next, an outline of the processing unit 16 will be described with reference to FIG. 3, which is a schematic diagram showing a configuration of the processing unit 16. As shown in FIG. 3, the processing unit 16 includes a chamber 20, a substrate holding mechanism 30, a processing fluid supply part 40, and a recovery cup 50. The substrate holding mechanism 30 is an example of a drying part.

The chamber 20 accommodates the substrate holding mechanism 30, the processing fluid supply part 40, and the recovery cup 50. A fan filter unit (FFU) 21 is installed on a ceiling of the chamber 20. The FFU 21 forms a downflow in the chamber 20.

The substrate holding mechanism 30 includes a holding part 31, a supporting part 32, and a driving part 33. The holding part 31 holds the wafer W in a horizontal position. The supporting part 32 is a member extending in the vertical direction, and has a proximal end portion rotatably supported by the driving part 33 and a distal end portion on which the holding part 31 is supported in a horizontal position. The driving part 33 rotates the supporting part 32 about the vertical axis.

The substrate holding mechanism 30 rotates the holding part 31 supported by the supporting part 32 by rotating the supporting part 32 by means of the driving part 33, thereby rotating the wafer W held by the holding part 31.

The processing fluid supply part 40 supplies a processing fluid to the wafer W. The processing fluid supply part 40 is connected to a processing fluid supply source 70.

The recovery cup 50 surrounds the holding part 31 and collects the treatment liquid scattering from the wafer W by the rotation of the holding part 31. A liquid drain port 51 is formed at the bottom of the recovery cup 50 and the treatment liquid collected by the recovery cup 50 is discharged from the liquid drain port 51 to the outside of the processing unit 16. An exhaust port 52 for discharging a gas supplied from the FFU 21 to the outside of the processing unit 16 is also formed at the bottom of the recovery cup 50.

Next, a specific configuration example of the processing unit 16 will be described with reference to FIG. 4, which is a schematic diagram showing a specific configuration example of the processing unit 16.

Figure 4:
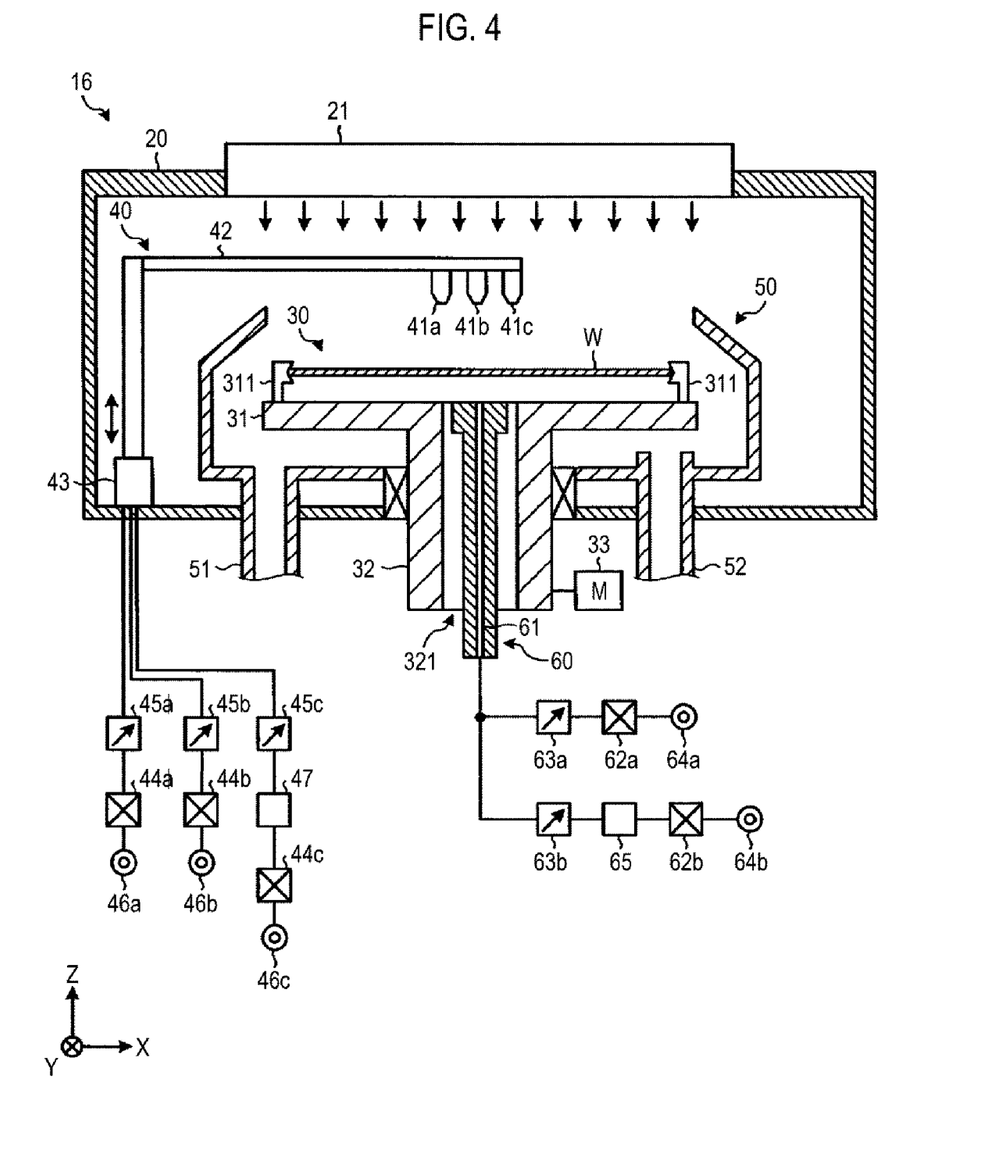
FIG. 4 is a schematic view showing a specific configuration example of the processing unit.

As shown in FIG. 4, a holding member 311 for holding the wafer W from a side surface of the wafer W is installed on an upper surface of the holding part 31 included in the substrate holding mechanism 30. The wafer W is held in a horizontal position by the holding member 311 in a state where the wafer W is slightly distanced from the upper surface of the holding part 31. In addition, the wafer W is held by the holding part 31 in a state where a surface of the wafer W on which substrate processing is to be performed faces upward.

The processing fluid supply part 40 includes a plurality of nozzles (in this embodiment, three nozzles) 41a, 41b, and 41c, an arm 42 for supporting the nozzles 41a, 41b, and 41c in a horizontal position, and a rotating/elevating mechanism 43 for rotating and elevating the arm 42.

The nozzle 41a is connected to a DHF supply source 46a via a valve 44a and a flow rate adjuster 45a. A chemical liquid for processing the wafer W, such as diluted hydrofluoric acid (DHF), is stored in the DHF supply source 46a.

The nozzle 41b is connected to a DIW supply source 46b via a valve 44b and a flow rate adjuster 45b. DIW (De-Ionized Water) is an example of a treatment liquid and is used, for example, for a treatment liquid supplying process (hereinafter also referred to as a rinsing process). The nozzle 41b is an example of a treatment liquid supply part.

The nozzle 41c is connected to an IPA supply source 46c via a valve 44c, a heating part 47, and a flow rate adjuster 45c. IPA is an example of a solvent having a lower surface tension than the treatment liquid and is used, for example, for a substituting process. The nozzle 41c is an example of a substitution part.

The treatment liquid used for the rinsing process is not limited to the DIW described above but may be any other kind of treatment liquid as long as it can remove a chemical liquid component from the wafer W. Further, the solvent used for the substituting process is not limited to IPA.

For example, a solvent having a lower surface tension than the treatment liquid, such as methanol, ethanol, cyclohexanone, acetone, tetrahydrofuran, propylene glycol-1-monomethylether acetate (PGMEA), N-methylpyrrolidone (NMP), or the like may be used as a solvent for the substituting process.

The DHF supplied from the DHF supply source 46a is discharged from the nozzle 41a. The DIW supplied from the DIW supply source 46b is discharged from the nozzle 41b. The IPA supplied from the IPA supply source 46c is heated to a temperature higher than the room temperature by the heating unit 47 and is discharged from the nozzle 41c.

The processing unit 16 further includes a lower surface supply part 60. The lower surface supply part 60 is inserted in a hollow portion 321 of the holding part 31 and the supporting part 32. A flow path 61 extending in the vertical direction is formed inside the lower surface supply part 60, and a DIW supply source 64a is connected to the flow path 61 via a valve 62a and a flow rate adjuster 63a. In addition, an IPA supply source 64b is connected to the flow path 61 via a valve 62b, a heating part 65, and a flow rate adjuster 63b.

The DIW supplied from the DIW supply source 64a is supplied to the flow path 61. The IPA supplied from the IPA supply source 64b is heated to a temperature higher than the room temperature by the heating part 65 and is supplied to the flow path 61.

In the processing unit 16 described above, a process of drying the wafer W using the IPA is performed. Here, the drying process according to the embodiment is performed by rotating the wafer W at a preset rotation number to shake off the IPA on the wafer W.

Figure 5:
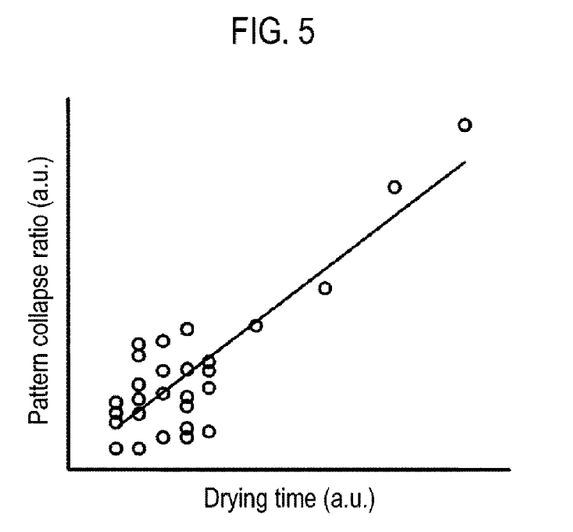
FIG. 5 is a view showing a relationship between a drying time of an entire wafer and a pattern collapse ratio of a wafer in IPA drying.

FIG. 5 is a view showing a relationship between a drying time of an entire wafer W and a pattern collapse ratio of the wafer W in IPA drying. As shown in FIG. 5, as the drying time of the entire wafer W decreases, the pattern collapse ratio decreases.

That is to say, in the IPA drying, the pattern collapse can be suppressed by reducing the drying time. It is considered that this is because the pattern collapse can be suppressed by reducing the time during which the surface tension of the IPA acts on the pattern formed on the wafer W.

Figure 6:
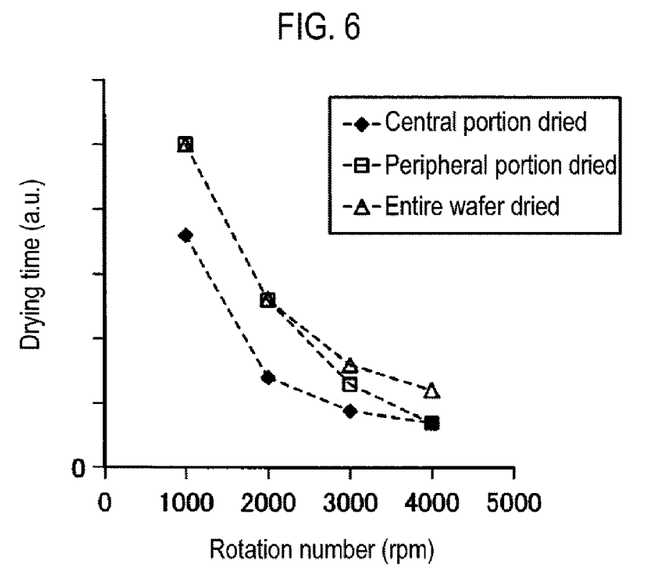
FIG. 6 is a view showing a relationship between a rotation number of a wafer, a drying time at a central portion of the wafer, a drying time at a peripheral portion of the wafer, and the drying time of the entire wafer according to the embodiment.

FIG. 6 is a view showing a relationship between a rotation number of the wafer W, a drying time of the central portion Wc, a drying time of the peripheral portion We, and the drying time of the entire wafer W according to the embodiment. As shown in FIG. 6, when the rotation number of the wafer W in the drying process of shaking off the IPA on the wafer W is 2,000 (rpm) or less, the drying time of the peripheral portion We coincides with the drying time of the entire wafer W.

That is to say, when the rotation number of the wafer W is 2,000 (rpm) or less, the peripheral portion We is last dried on the wafer W, thereby completing the drying process.

On the other hand, when the rotation number of the wafer W in the drying process of shaking off the IPA on the wafer W is greater than 2,000 (rpm), the drying time of the central portion Wc and the drying time of the peripheral portion We do not coincide with the drying time of the entire wafer W.

That is to say, when the rotation number of the wafer W is greater than 2,000 (rpm), the drying process on the wafer W is completed by last drying a portion other than the central portion Wc and the peripheral portion We, that is to say, the intermediate portion Wm.

As described above, it is possible to prevent the peripheral portion We from being last dried by rotating the wafer W at a preset rotation number R2 greater than 2,000 (rpm) in the drying process. Thus, since it is possible to reduce a contact time between the IPA and a pattern at the peripheral portion We, pattern collapse at the peripheral portion We of the wafer W can be suppressed.

In addition, in the embodiment, IPA substituted for the DIW may be supplied to the wafer W at a temperature higher than the room temperature. In this manner, the drying (evaporation) of IPA on the wafer W can be promoted. Thus, pattern collapse at the peripheral portion We of the wafer W can be further suppressed.

<Various Modifications>

Figure 7A:
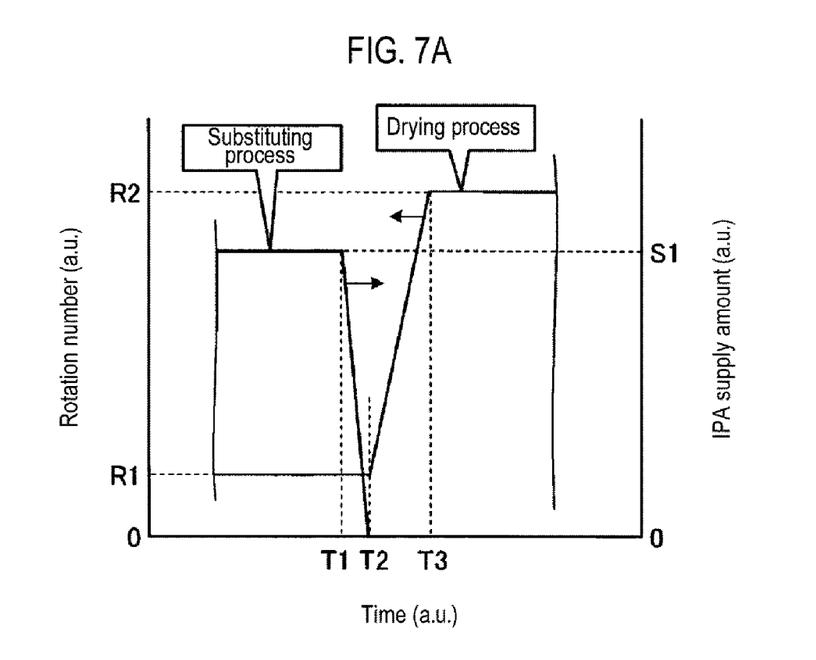
FIG. 7A is a view showing a transition of a substituting process and transition of a drying process in a reference example.

Subsequently, various modifications of the embodiment will be described with reference to FIGS. 7A to 9. FIG. 7A is a view showing a transition of a substituting process and a transition of a drying process in a reference example, and FIG. 7B is a view showing a transition of a substituting process and a transition of a drying process according to a first modification of the embodiment.

As shown in FIG. 7A, in the substituting process in the reference example, IPA is supplied to the wafer W by a predetermined supply amount S1 until time T1 and thereafter, the supply amount becomes zero at time T2. The rotation number of the wafer W is increased from the rotation number R1 at the same time when the supply amount of IPA becomes zero (that is to say, from time T2), and reaches the preset rotation number R2 at time T3. Thus, the drying process of shaking the IPA off is performed.

That is to say, in the reference example shown in FIG. 7A, after the supply amount of IPA becomes zero, the wafer W is rotated at the preset rotation number R2.

Figure 7B:
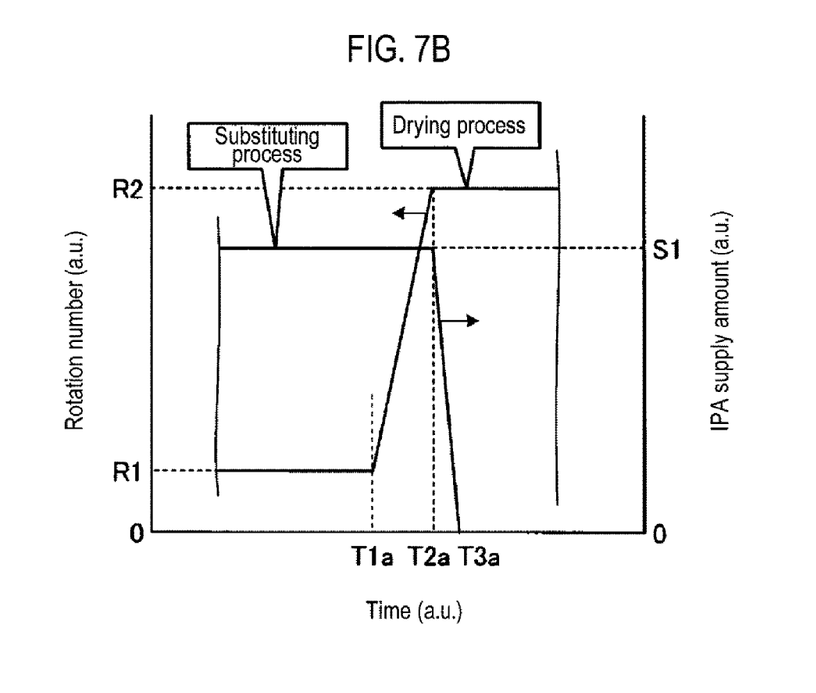
FIG. 7B is a view showing a transition of a substituting process and transition of a drying process according to a first modification of the embodiment.

On the other hand, as shown in FIG. 7B, the drying process according to the first modification increases the rotation number R1 of the wafer W from time T1a prior to time T3a at which the substituting process is completed. The IPA is supplied to the wafer W by the predetermined supply amount S1 until time T2a at which the wafer W reaches the rotation number R2. Thereafter, the supply amount of IPA becomes zero at time T3a.

That is to say, in the first modification shown in FIG. 7B, the wafer W is rotated at the preset rotation number R2 before the supply amount of IPA becomes zero.

Figure 8:
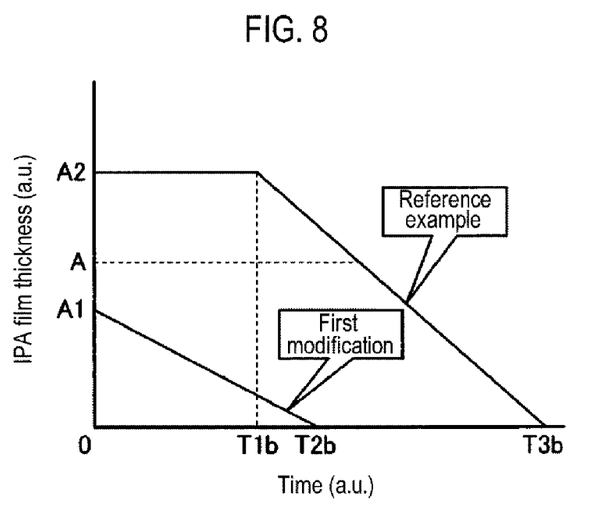
FIG. 8 is a graph showing a transition of IPA film thickness at the peripheral portion of the wafer in the reference example and the first modification.

FIG. 8 is a graph showing a transition of IPA film thickness at the peripheral portion We of the wafer W in the reference example and the first modification. In FIG. 8, the time at which the wafer W reaches the rotation number R2 (i.e., time T3 in the reference example and time T2a in the first modification example) is set to time zero.

As shown in FIG. 8, in the reference example, the IPA film thickness at the peripheral portion We is substantially constant at a film thickness A2 until time T1b. This is because the amount of IPA moving from the central portion Wc and the intermediate portion Wm toward the peripheral portion We becomes substantially equal to the amount of IPA shaken off from the peripheral portion We.

Thereafter, as the amount of IPA moving from the central portion Wc and the intermediate portion Wm toward the peripheral portion We decreases, the IPA film thickness at the peripheral portion We begins to decrease. Then, the film thickness becomes zero at time T3b and the drying process at the peripheral portion We is completed.

On the other hand, in the first modification, the IPA film thickness at the peripheral portion We at time zero can be set to a film thickness A1 smaller than the film thickness A2 in the reference example. This is because, as described above, the substituting process can be completed with a smaller IPA film thickness by rotating the wafer W at the preset rotation number R2 before the supply amount of IPA becomes zero.

Further, in the first modification, by setting the IPA film thickness at the peripheral portion We to the film thickness A2 that is equal to or less than a preset film thickness A before the supply amount of IPA becomes zero, it is possible to reduce the IPA film thickness at the peripheral portion We from the time zero without generating a transition period during which the IPA film thickness is kept substantially constant.

This is because the amount of IPA moving from the central portion Wc and the intermediate portion Wm toward the peripheral portion We can be made smaller than the amount of IPA shaken off from the peripheral portion We by setting the IPA film thickness at the peripheral portion We to be equal to or smaller than the preset film thickness A.

Thus, as shown in FIG. 8, in the first modification, the drying process for the peripheral portion We can be completed at an earlier time T2b than in the reference example. Therefore, according to the first modification, the pattern collapse at the peripheral portion We of the wafer W can be further suppressed.

Alternatively, in the first modification, by properly adjusting various parameters such as timings of the substituting process and the drying process, the IPA on the wafer W may be dried (evaporated) in place without being moved toward the peripheral portion We in the drying process. In other words, when the substituting process is completed, the IPA film thickness on the wafer W may be controlled to a predetermined film thickness at which the IPA is dried (evaporated) in place without being moved on the wafer W.

In this manner, it is possible to complete the drying process in the peripheral portion We in a further shorter time. Thus, pattern collapse at the peripheral portion We of the wafer W can be further suppressed.

Figure 9:
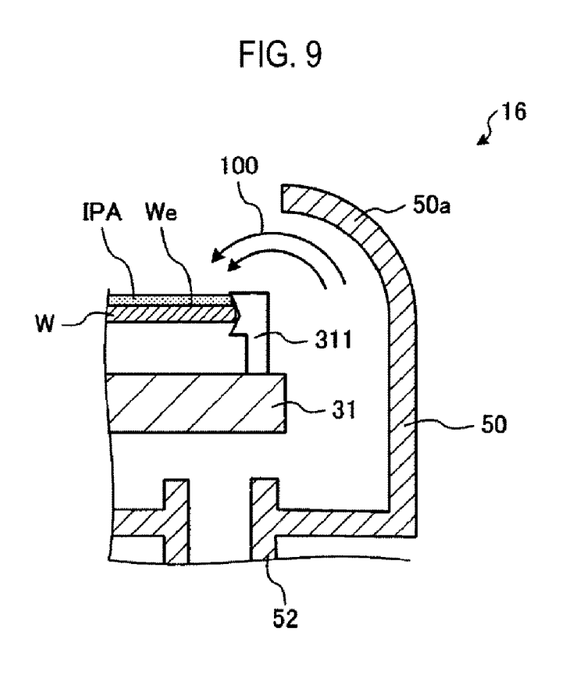
FIG. 9 is a view showing an example of a drying promoting process according to a second modification of the embodiment.

In addition, in the embodiment, in order to complete the drying process at the peripheral portion We of the wafer W in a short time, a drying promoting process for promoting the drying (evaporation) of IPA may be performed on the peripheral portion We. FIG. 9 is a view showing an example of a drying promoting process according to a second modification of the embodiment, in which the vicinity of the peripheral portion We of the wafer W in the processing unit 16 is enlarged.

As shown in FIG. 9, by machining an upper end portion 50a of the recovery cup 50 to a predetermined shape (for example, an arc shape), an air flow 100 flowing toward the peripheral portion We along the upper end portion 50a is generated. By blowing the generated air flow 100 to the peripheral portion We, the drying promoting process can be performed on the peripheral portion We.

In this manner, it is possible to complete the drying process in the peripheral portion We in a further shorter time. Thus, pattern collapse at the peripheral portion We of the wafer W can be further suppressed.

The drying promoting process is not limited to the example shown in FIG. 9. For example, the drying promoting process may be performed by installing a separate discharge port of an inert gas or the like toward the peripheral portion We in the processing unit 16 and discharging the inert gas or the like from the discharge port.

Further, as the drying promoting process, the peripheral portion We of the wafer W may be heated during the drying process. For example, it is possible to increase the temperature of the peripheral portion We of the wafer W by discharging IPA having a temperature higher than the room temperature from the lower surface supply part 60 toward a rear surface portion, which corresponds to the peripheral portion We of the wafer W, via the flow path 61. Further, the peripheral portion We of the wafer W may be heated by means of a heater separately installed in the vicinity of the peripheral portion We.

<Procedure of Substrate Processing>

Figure 10:
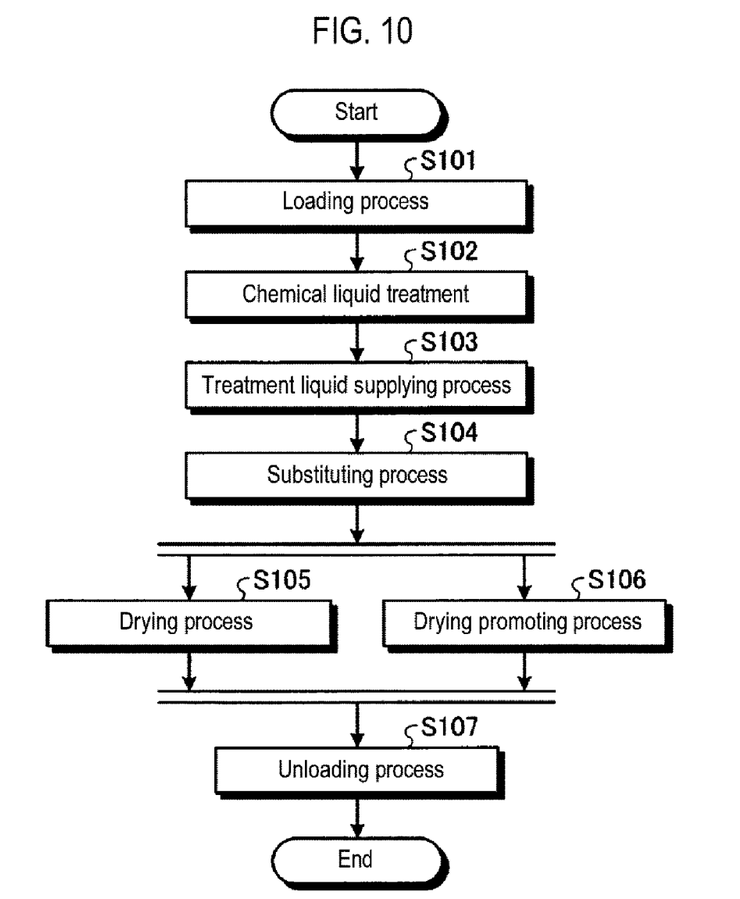
FIG. 10 is a flowchart showing a procedure of substrate processing executed by the substrate processing system.

Subsequently, a procedure of substrate processing according to an embodiment will be described with reference to FIG. 10. FIG. 10 is a flowchart showing a procedure of substrate processing executed by the substrate processing system 1.

As shown in FIG. 10, in the processing unit 16, first, a loading process is performed (step S101). In the loading process, the controller 18 controls the substrate transfer device 17 to load the wafer W into the chamber 20 of the processing unit 16. The wafer W is held by the holding member 311 in a state where the surface of the wafer W to be subjected to substrate processing faces upward. Thereafter, the controller 18 controls the driving part 33 to rotate the substrate holding mechanism 30 at a predetermined rotation number (for example, the rotation number R1).

Next, in the processing unit 16, a chemical liquid treatment is performed (step S102). Its the chemical liquid treatment, the controller 18 moves the nozzle 41a of the processing fluid supply part 40 to above the center of the wafer W. Thereafter, the controller 18 opens the valve 44a for a predetermined time to supply DHF as a chemical liquid to the surface of the wafer W.

The DHF supplied to the surface of the wafer W spreads over the entire surface of the wafer W by a centrifugal force accompanying the rotation of the wafer W. Thus, a natural oxide film formed on the wafer W is removed by the DHF.

Next, in the processing unit 16, a treatment liquid supplying process is performed (step S103). In the treatment liquid supplying process, the controller 18 moves the nozzle 41b of the processing fluid supply part 40 to above the center of the wafer W, and opens the valve 44b for a predetermined time to supply DIW as a treatment liquid to the surface of the wafer W.

The DIW supplied to the surface of the wafer W spreads over the entire surface of the wafer W by the centrifugal force accompanying the rotation of the wafer W. Thus, the DHF remaining on the surface of the wafer W is removed by the DIW. In the treatment liquid supplying process, the DIW may also be supplied to the rear surface of the wafer W from the lower surface supply part 60 via the flow path 61.

Next, in the processing unit 16, a substituting process is performed (step S104). In the substituting process, the controller 18 moves the nozzle 41c of the processing fluid supply part 40 to above the center of the wafer W, and opens the valve 44c for a predetermined time to supply IPA as a solvent to the surface of the wafer W.

The IPA supplied to the surface of the wafer W spreads over the entire surface of the wafer W by the centrifugal force accompanying the rotation of the wafer W. Thus, the DIW remaining on the surface of the wafer W is substituted with the IPA. During the substituting process, the controller 18 may operate the heating part 47 to heat the IPA to a temperature higher than the room temperature and supply the heated IPA to the wafer W.

Subsequently, in the processing unit 16, a drying process for drying the wafer W is performed (step S105). In the drying process, for example, the controller 18 controls the driving part 33 to rotate the substrate holding mechanism 30 at the preset rotation number R2 to shake off the IPA on the wafer W held by the holding member 311.

In parallel with the drying process, in the processing unit 16, a drying promoting process for promoting the drying (evaporation) of IPA at the peripheral portion We of the wafer W is performed (step S106). In this drying promoting process, for example, the air flow 100 is blown to the peripheral portion We via the upper end portion 50a of the recovery cup 50 that has been machined to a predetermined shape.

Thereafter, in the processing unit 16, an unloading process is performed (step S107). In the unloading process, the controller 18 controls the driving part 33 to stop the rotation of the wafer W and then controls the substrate transfer device 17 to unload the wafer W from the processing unit 16. Upon completion of this unloading process, a series of substrate processing for one wafer W is completed.

Although the embodiment of the present disclosure has been described above, the present disclosure is not limited to the above embodiment but various modifications may be made without departing from the spirit and scope of the present disclosure. For example, in the embodiment, blowing the air flow 100 to the peripheral portion We via the recovery cup 50 that has been machined to a predetermined shape, installing the separate discharge port of an inert gas or the like in the processing unit 16, and heating the peripheral portion We of the wafer W are illustrated as the drying promoting process. However, two or more of the above-mentioned methods may be performed together as the drying promoting process.

The substrate processing method according to the embodiment includes the treatment liquid supplying process (step S103), the substituting process (step S104), and the drying process (step S105). In the treatment liquid supplying process (step S103), the treatment liquid (DIW) is supplied to the substrate (wafer W) held in a horizontal position. In the substituting process (step S104), the treatment liquid (DIW) supplied to the substrate (wafer W) is substituted with the solvent (IPA) having a lower surface tension than the treatment liquid (DIW). In the drying process (step S105), the solvent (IPA) on the substrate (wafer W) is shaken off at the preset rotation number R2 so that the intermediate portion Wm located between the central portion We and the peripheral portion We of the substrate (wafer W) is last dried. Thus, pattern collapse at the peripheral portion We of the wafer W can be suppressed.

In the substrate processing method according to the embodiment, in the substituting process (step S104), the film thickness of the solvent (IPA) in the peripheral portion We is set to be equal to or less than the preset film thickness A before the supply amount of solvent (IPA) becomes zero. In this manner, it is possible to reduce the IPA film thickness in the peripheral portion We from the start of the drying process without generating a transition period during which the IPA film thickness is kept constant. Thus, pattern collapse at the peripheral portion We of the wafer W can be further suppressed.

In the substrate processing method according to the embodiment, in the substituting process (step S104), the substrate (wafer W) is rotated at the preset rotation number R2 before the supply amount of solvent (IPA) becomes zero. In this manner, it is possible to make the IPA film in the peripheral portion We thin at the start of the drying process. Thus, pattern collapse at the peripheral portion We of the wafer W can be further suppressed.

In the substrate processing method according to the embodiment, in the drying process (step S105), the amount of solvent (IPA) to be dried (evaporated) at the peripheral portion We is made larger than the amount of solvent (IPA) to be moved toward the peripheral portion We. In this manner, it is possible to reduce the IPA film thickness in the peripheral portion We from the start of the drying process without generating a transition period during which the IPA film thickness is kept constant. Thus, pattern collapse at the peripheral portion We of the wafer W can be further suppressed.

In the substrate processing method according to the embodiment, in the drying step (step S105), the solvent (IPA) is dried (evaporated) in place without being moved toward the peripheral portion We. In this manner, it is possible to complete the drying process in the peripheral portion We in a shorter time. Thus, pattern collapse at the peripheral portion We of the wafer W can be further suppressed.

The substrate processing method according to the embodiment further includes the drying promoting process (step S106) for promoting the drying (evaporation) of the solvent (IPA) at the peripheral portion We. In this manner, it is possible to complete the drying process in the peripheral portion We in a shorter time. Thus, pattern collapse at the peripheral portion We of the wafer W can be further suppressed.

In the substrate processing method according to the embodiment, in the drying promoting process (step S106), the air flow 100 is blown to the peripheral portion We. In this manner, it is possible to complete the drying process in the peripheral portion We in a shorter time. Thus, pattern collapse at the peripheral portion We of the wafer W can be further suppressed.

In the substrate processing method according to the embodiment, in the drying promoting process (step S106), the peripheral portion We is heated. In this manner, it is possible to complete the drying process in the peripheral portion We in a shorter time. Thus, pattern collapse at the peripheral portion We of the wafer W can be further suppressed.

In the substrate processing method according to the embodiment, in the substituting process (step S104), the treatment liquid (DIW) is substituted with the solvent (IPA) having a temperature higher than the room temperature. In this manner, it is possible to promote the drying (evaporation) of IPA on the wafer W. Thus, pattern collapse at the peripheral portion We of the wafer W can be further suppressed.

The substrate processing apparatus according to the embodiment includes the treatment liquid supply part (nozzle 41b), the substitution part (nozzle 41c), and the drying part (substrate holding mechanism 30). The treatment liquid supply part (nozzle 41b) supplies the treatment liquid (DIW) to the substrate (wafer W) held in a horizontal position. The substitution part (nozzle 41c) substitutes the treatment liquid (DIW) supplied to the substrate (wafer W) with the solvent (IPA) having a lower surface tension than the treatment liquid (DIW). The drying part (substrate holding mechanism 30) shakes off the solvent (IPA) on the substrate (wafer W) at the preset rotation number R2 so that the intermediate portion Wm located between the central portion Wc and the peripheral portion We of the substrate (wafer W) is last dried. In this manner, pattern collapse at the peripheral portion We of the wafer W can be suppressed.

According to the present disclosure in some embodiments, it is possible to suppress pattern collapse at a peripheral portion of a wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
supplying a treatment liquid to a substrate held in a horizontal position;
substituting the treatment liquid supplied to the substrate with a solvent having a lower surface tension than the treatment liquid; and
drying the substrate by shaking off the solvent on the substrate at a preset rotation number so that an intermediate portion of the substrate located between a central portion and a peripheral portion of the substrate is last dried,
wherein the solvent, which has a temperature higher than a room temperature, is discharged toward a rear surface of the peripheral portion of the substrate, and
wherein an air flow flowing toward the peripheral portion of the substrate along an upper end portion of a recovery cup is generated and blown to the peripheral portion by machining the upper end portion to have an arc shape.

2. The method of claim 1, wherein substituting the treatment liquid includes making a film thickness of the solvent at the peripheral portion of the substrate equal to or less than a preset film thickness before a supply amount of the solvent becomes zero.

3. The method of claim 1, wherein substituting the treatment liquid includes rotating the substrate at the preset rotation number before a supply amount of the solvent becomes zero.

4. The method of claim 1, wherein drying the substrate includes setting an amount. of the solvent to be evaporated at the peripheral portion of the substrate to be larger than an amount of the solvent to be moved toward the peripheral portion of the substrate.

5. The method of claim 1, wherein drying the substrate includes evaporating the solvent in place without moving the solvent toward the peripheral portion of the substrate.

6. The method of claim 1, further comprising promoting evaporation of the solvent at the peripheral portion of the substrate.

7. The method of claim wherein substituting the treatment liquid includes substituting the treatment liquid with the solvent having a temperature higher than the room temperature.

8. The method of claim 1, wherein, in heating the peripheral portion of the substrate, the solvent is discharged from a lower surface supply part, which is disposed below the substrate.

9. The method of claim 8, wherein, in heating the peripheral portion of the substrate, the solvent is discharged through a flow path, which is formed inside the lower surface supply part.

* * * * *